United States Patent
Hughes (10) Patent No.: US 7,633,749 B2
(45) Date of Patent: Dec. 15, 2009

(54) FRONT ACCESS ENCLOSURE

(76) Inventor: Robert M. Hughes, 4790 Prestbury Dr., Suwanee, GA (US) 30024

( * ) Notice: Subject to any disclaimer, the term of this patent is extended or adjusted under 35 U.S.C. 154(b) by 0 days.

(21) Appl. No.: 12/004,586

(22) Filed: Dec. 21, 2007

(65) Prior Publication Data

US 2009/0161322 A1 Jun. 25, 2009

(51) Int. Cl.
*H05K 7/02* (2006.01)
(52) U.S. Cl. .............................. 361/679.4; 361/679.02
(58) Field of Classification Search ................ 361/724, 361/679.4

See application file for complete search history.

(56) References Cited

U.S. PATENT DOCUMENTS

| | | | | |
|---|---|---|---|---|
| 5,513,922 A | * | 5/1996 | Umbach | ..................... 400/691 |
| 6,018,456 A | * | 1/2000 | Young et al. | ............. 361/679.4 |
| 6,122,019 A | * | 9/2000 | Do et al. | ..................... 348/843 |
| 6,560,106 B2 | * | 5/2003 | Ivey et al. | ..................... 361/695 |
| 6,937,461 B1 | * | 8/2005 | Donahue, IV | ............... 361/622 |
| 7,322,737 B2 | * | 1/2008 | Corbett et al. | .............. 439/683 |
| 7,443,661 B2 | * | 10/2008 | Xu et al. | ................ 361/679.55 |
| 2005/0101182 A1 | * | 5/2005 | Nakamura et al. | .......... 439/529 |
| 2005/0185368 A1 | * | 8/2005 | Radtke | ....................... 361/681 |
| 2006/0066186 A1 | * | 3/2006 | Kita | .......................... 312/10.1 |
| 2007/0195206 A1 | * | 8/2007 | Duggan et al. | .............. 348/744 |

* cited by examiner

*Primary Examiner*—Jayprakash N Gandhi
*Assistant Examiner*—Ingrid Wright (57) ABSTRACT

An enclosure and method of construction for use with electronic devices such as computers, amplifiers, switching systems, receivers, video monitors, and televisions, allows a user to access virtually all connector ports on a given piece of equipment from the front of the equipment by displacing a moveable front accessible control panel which supports control mechanisms by which to regulate the equipment. The ideal enclosure may be elevated on adjustable feet such that connector cables from connected peripheral devices may be routed beneath the enclosure to corresponding connector ports at the front of the enclosure.

3 Claims, 7 Drawing Sheets

FRONT ACCESS ENCLOSURE

FIELD OF THE INVENTION

The present invention relates to improved technology in the field of enclosures for electronic equipment, and more particularly to an enclosure and method of construction which enables a user frontal access to virtually all connector ports on a given piece of equipment via displacement of a movable front accessible control panel, and which also allows a user to quickly and concealably route connector cables from connected devices to the front of the enclosure by routing the cables beneath the enclosure.

BACKGROUND OF THE INVENTION

Currently available electronic devices such as computers, amplifiers, switching systems, receivers, televisions, and various other kinds of equipment may support a limited number of connector ports mounted on a front face for ease of accessibility. Such ports are usually directed toward temporary applications, and their functionality range is generally very limited, e.g., to USB ports, earphone jacks, temporary camera connections, or the like. Other less-frequently accessed or semi-permanent type ports, such as coaxial, network, DIN, HDMI, optical, digital, S-video, keyboard, mouse, component video, CAT-5, speaker wire, VGA, or RCA, for example, depending on the type of equipment in question, are typically mounted on the backs of enclosures and are therefore extremely difficult to access. This is especially true at times where more frequent access may be necessary, as during an initial set-up or during evaluation or trouble-shooting of the equipment.

SUMMARY OF THE INVENTION

Many currently available varieties of audio, video, switching, amplifier, and computer equipment provide limited numbers and limited types of connector ports on a front surface to allow a user quick and easy access. Often, however, front access connector ports provide the advantage of convenience and quick access only for universal jacks or USB compatible devices, such as headphones or thumb drives, or other similarly limited applications in which a user is highly likely to access the provided ports with a great degree of regularity.

Conversely, semi-permanent wiring on equipment such as audio, video, or computer units are usually located at the rear of the equipment, making it necessary for a user to physically manipulate a given unit to gain access to a majority of its connector ports. Over the life of an installation, these connections may need to be accessed from time to time as peripheral devices change or as problems arise that require rearranging connections for debugging and the like.

This is particularly problematic if the equipment in question is located in a small or confined area. Where space does not allow for lateral displacement of the equipment, the only option left to a user for accessing the rear panel connector ports may be to move the equipment directly forward of its initial location. This increases the possibility of accidentally disconnecting cables that are already connected to the equipment, and thus may also increase a user's investment of time and effort by necessitating a search to locate the rear connector ports from which the cables were disconnected. Worse yet, in the event of multiple disconnects, a user may have to engage in a series of wiring experiments in order to determine what the original configuration of the cables was.

In some cases, the cables connected to the rear connector ports may be so short that even pulling the equipment forward of its initial location is not feasible. Extreme space restriction such as this may require a user to resort to a flashlight and a mirror to assess and/or alter cable connections. This can be extraordinarily frustrating, and may even prove to be an impossible alternative in situations where there are large numbers of connectors in use.

The task of accessing the connector ports can also be a challenge where equipment is mounted to a rack or is stacked underneath other equipment. Often, turning a rack to access connections at the rear of the equipment mounted on the rack may not be practicable, especially where space is limited. Access is further complicated where the equipment is heavy or cumbersome, which is frequently the case. A single user may not be physically able to handle the weight of unwieldy electronic equipment without assistance, either in human form or in the form of a temporary support structure, which may or may not be available at the specific moment that access is needed. Further, even where help can be had in lifting or moving the equipment, there is still the possibility of dropping the unit and causing damage to fragile or expensive equipment, personal injury, or both.

What is therefore needed is an enclosure and method of construction which will allow a user to fully access virtually all connector ports on a given piece of electronic equipment from the front of the equipment. The enclosure includes a moveable front accessible control panel which supports control mechanisms by which to adjust the equipment. The ideal enclosure is elevated on feet such that connector cables from connected devices may be passed beneath the enclosure and routed to peripheral devices from the corresponding connector ports at the front of the enclosure. Routing the cables in this manner will allow a user to quickly and efficiently neaten the appearance of the enclosure set-up after settling on a desired wiring configuration.

BRIEF DESCRIPTION OF THE DRAWINGS

The invention, its configuration, construction, and operation will be best further described in the following detailed description, taken in conjunction with the accompanying drawings in which.

DETAILED DESCRIPTION OF THE INVENTION

Figure 1:
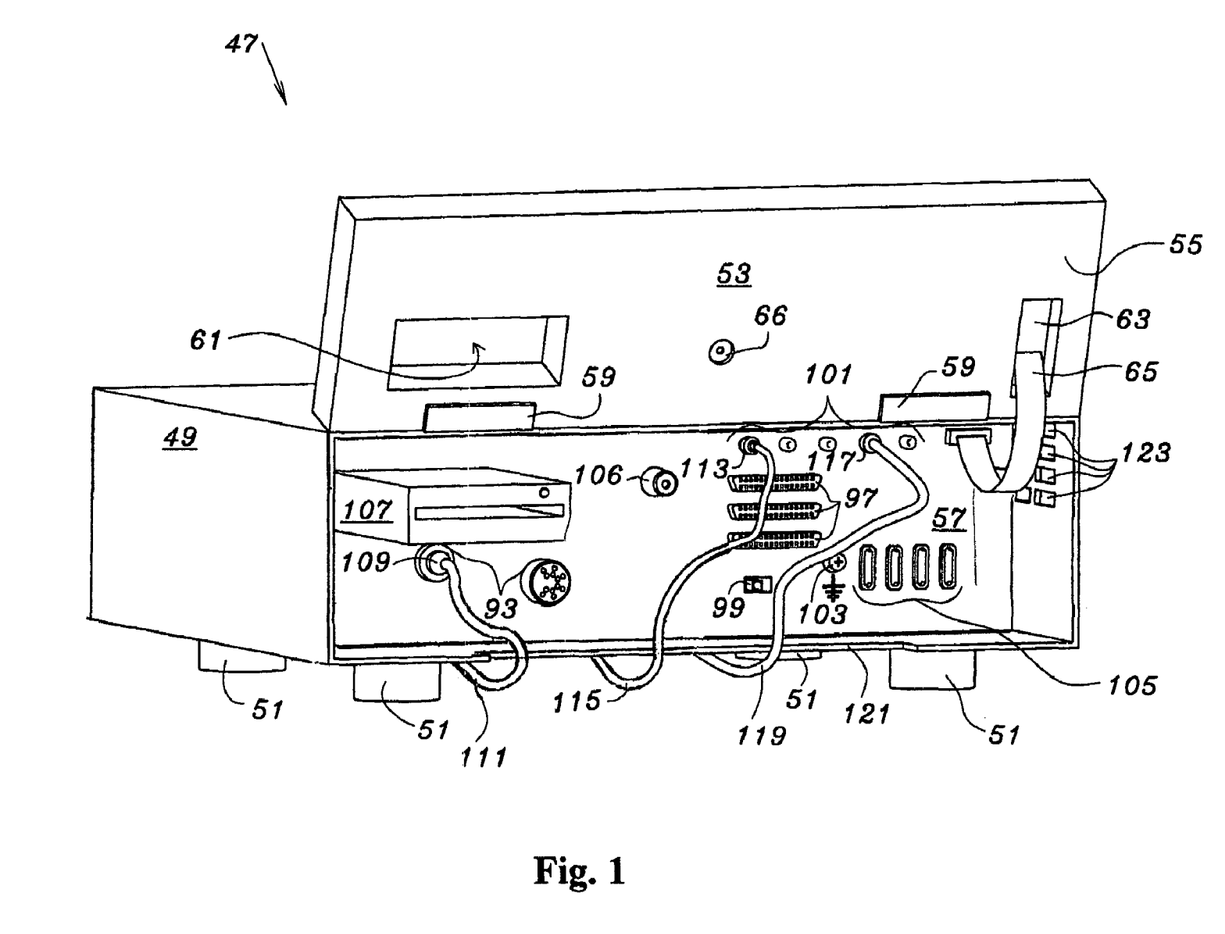
FIG. 1 is a perspective front view of the first embodiment of the present invention and illustrates an enclosure with a recessed connector panel, accessible through a moveable front accessible control panel (shown in an open position) and having a plurality of connector ports thereon, and cabled connectors attached to the connector ports.

The description and operation of the invention will be best initiated with reference to FIG. 1, which is a perspective front view of a first embodiment of the present invention and illustrates an enclosure 47 and which includes a housing 49 equipped with adjustable feet 51 and a moveable front accessible control panel 53. Moveable front accessible control panel 53 is shown in an open position so that its rear surface 55 is visible, as is recessed connector panel 57 which is normally concealed by moveable front accessible control panel 53 when moveable front accessible control panel 53 is in a closed position.

Moveable front accessible control panel 53 is illustrated as having hinges 59 by which it is attached to housing 49 of enclosure 47. Moveable front accessible control panel 53 is shown as being hinged at the top, although it could conceivably be hinged at the bottom or at the left or right sides. Moreover, moveable front accessible control panel 53 could be completely detachable from housing 49 to provide unrestricted access to recessed connector panel 57 without the worry of damaging or stressing hinges 59 during access. Finally, although moveable front accessible control panel 53 is illustrated as being hinged, it may conceivably be secured to housing 49 by any method of attachment which will allow moveable front accessible control panel 53 to be displaced such that front access to recessed connector panel 57 is possible.

Moveable front accessible control panel 53 may further include an opening 61 through which may allow a user to access certain components of enclosure 47 through moveable front accessible control panel 53 when moveable front accessible control panel 53 is closed. Moveable front accessible control panel 53 further includes a recess 63 to accommodate and prevent crimping of a ribbon connector 65 when moveable front accessible control panel 53 is in a closed position. As shown in FIG. 1, moveable front accessible control panel 53 may enclose a circuit board (not illustrated) such that ribbon connector 65 would facilitate communication between any controls that may be located on moveable front accessible control panel 53 and any controlled components inside housing 49. Moveable front accessible control panel 53 may also include a transmitter 66 which may be an optical or radio transmitter, for example, for communicating with components in housing 49.

For exemplary purposes, recessed connector panel 57 is illustrated as having a pair of multi-pin connector ports 93, several parallel ports 97, a switch 99, a plurality of male connector ports 101, a ground 103, and several HDMI connectors 105, although the possibilities for connector types or combinations on recessed connector panel 57 are limitless and depend only upon the intended function of the overall device.

A receiver 106 on recessed connector panel 57 may receive a signal from transmitter 66, such as an optical or radio signal, to allow control of components inside housing 49 when moveable front accessible control panel 53 is closed and transmitter 66 and receiver 106 are aligned. This may be a desirable feature where moveable front accessible control panel 53 is designed to be fully removable from enclosure 47. Enclosure 47 also includes a disk drive 107, which is situated forward of recessed connector panel 57 to facilitate user access to disk drive 107 through opening 61 in moveable front accessible control panel 53 when moveable front accessible control panel 53 is in a closed position.

FIG. 1 illustrates a first connector 109 having an attached first connector cable 111 and coupled with one of the multi-pin connector ports 93, a second connector 113 having an attached second connector cable 115 and coupled with one of the connector ports 101, and a third connector 117 having an attached third connector cable 119 and coupled with another of the male connector ports 101.

Connector cables 111, 115, and 119 are furthermore shown extending underneath enclosure 47 between adjustable feet 51 and toward the rear of enclosure 47. Once connector cables 111, 115, and 119 exit the rear of enclosure 47, they may be subsequently connected to peripheral equipment and the like while corresponding connectors 109, 113, and 117 remain fully accessible to a user from the front of enclosure 47.

Recessed connector panel 57 is ideally recessed from front edge of housing 49 so that there is sufficient space between recessed connector panel 57 and rear surface 55 of moveable front accessible control panel 53 to minimize deformity of attached connector cables 111, 115, and 119 when moveable front accessible control panel 53 is in a closed position. For example, bigger and/or less flexible cables requiring a wider radius will require greater clearance between recessed connector panel 57 and moveable front accessible control panel 53, while smaller and/or more flexible cables capable of a tighter radius will require less clearance. It may be that a device having all small/flexible cables might require less clearance, a device having all larger/inflexible cables might require greater clearance and a mixed set of cables would require at least enough clearance to accommodate the largest or most inflexible cable in the grouping. For example, the setback space between recessed connector panel 57 and moveable front accessible control panel 53 may be anywhere from about 1 inch to about 6 inches in some equipment.

Adjustable feet 51 may be vertically extended to create sufficient space beneath enclosure 47 to pass multiple cables such as connector cables 111, 115, and 119. The lower front edge of housing 49 may include an indentation 121 which, together with rear surface 55 of moveable front accessible control panel 53, would define an accommodation space to protect and conceal connector cables (such as connector cables 111, 115, and 119) routed underneath enclosure 47 from being pinched or bound when moveable front accessible control panel 53 is in a closed position. Moveable front accessible control panel 53 may also extend below the lower front edge of housing 49 to further conceal connector cables 111, 115, and 119 from sight.

Where heat dissipation makes it undesirable to compromise air flow by routing numerous cables underneath enclosure 47, adjustable feet 51 may be further extended vertically to increase the available space between enclosure 47 and any supporting structure such as a table.

FIG. 1 illustrates a series of vents 123 at the right side of housing 49 to aid in ventilation of components within enclosure 47. Although vents 123 are illustrated as limited to only one side of housing 49, housing 49 could conceivably include additional vents along the top, bottom or left side.

Figure 2:
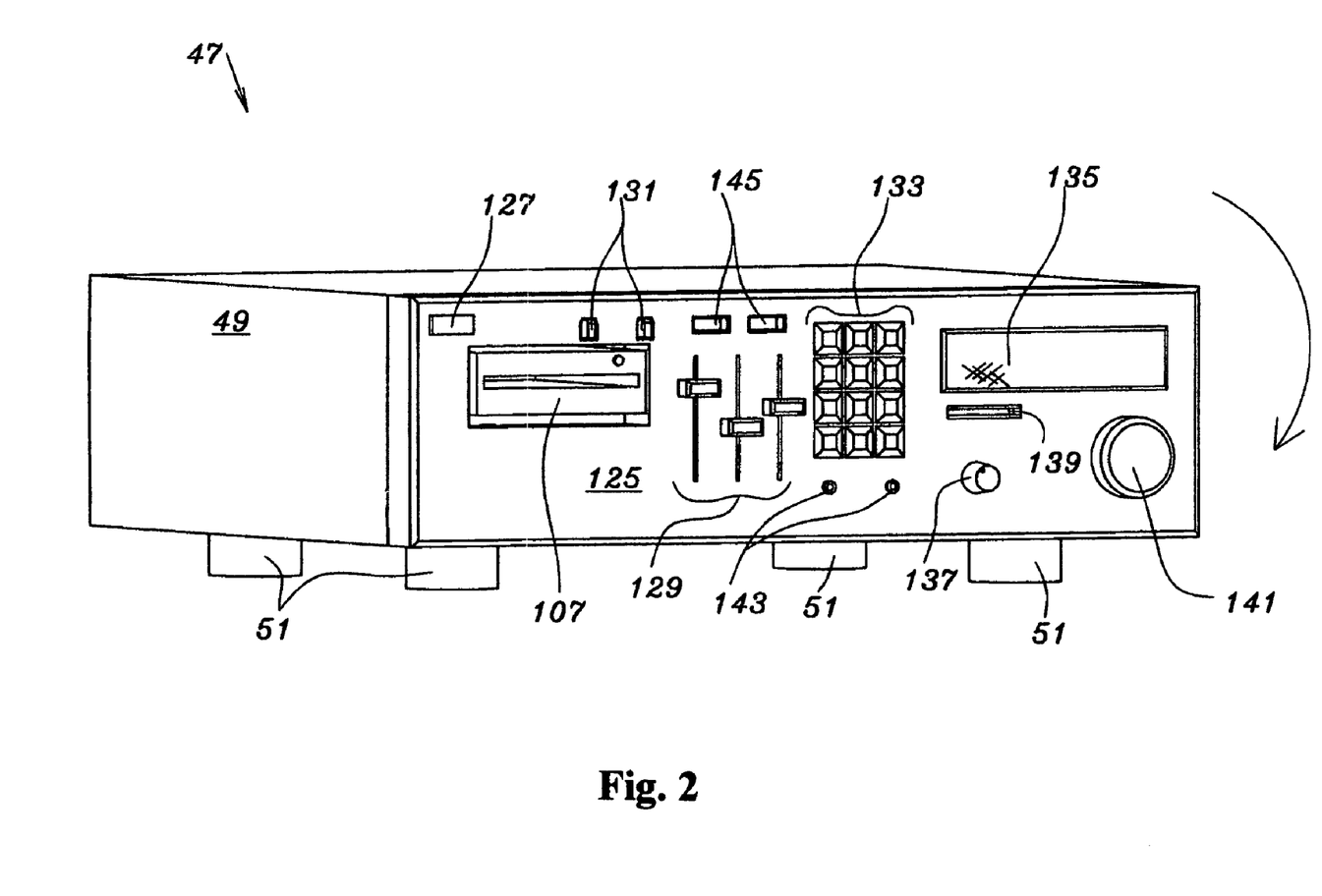
FIG. 2 is a perspective front view of the enclosure of FIG. 1 and illustrates the moveable front accessible control panel in a closed position.

FIG. 2 is a perspective front view of the enclosure 47 of FIG. 1 which illustrates moveable front accessible control panel 53 in a closed position, completely concealing recessed connector panel 57 and instead revealing front surface 125 of moveable front accessible control panel 53.

For exemplary purposes, FIG. 2 illustrates front surface 125 of moveable front accessible control panel 53 as having a power button 127, a plurality of vernier knobs 129, a pair of sockets 131, a number pad 133, an video output device 135, a dial 137, a multimedia slot 139, a rotary knob 141, a pair of jacks 143 and a pair of female connector ports 145, all of which may control a variety of controlled components inside enclosure 47. Moveable front accessible control panel 53 may have a greater number, a lesser number, and/or an entirely different variety of controls than those illustrated in FIG. 2, depending on the function of the overall device. Also visible in FIG. 2 are adjustable feet 51 and disk drive 107, which is visible through opening 61 in moveable front accessible control panel 53.

Figure 3:
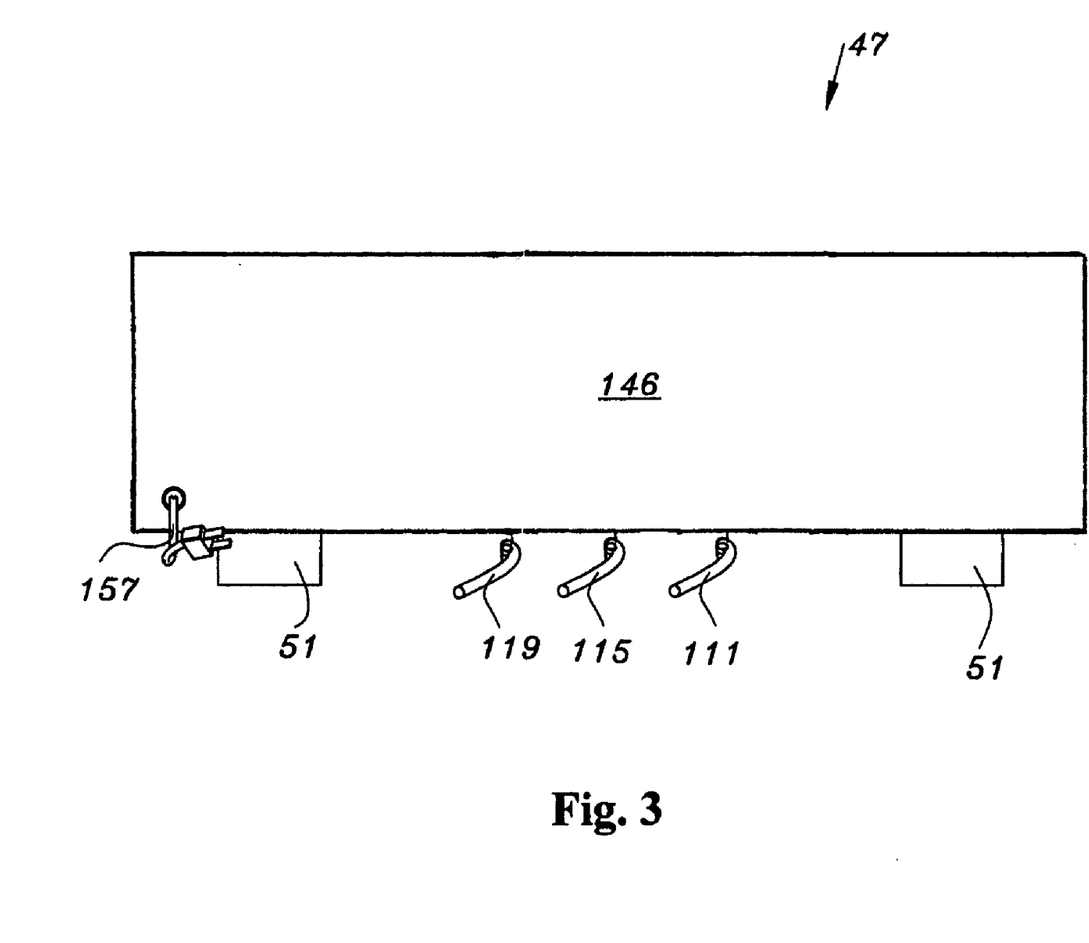
FIG. 3 is a rear view of the enclosure of FIGS. 1 and 2 which illustrates a rear wall and connector cables extending from underneath the enclosure, and FIG. 3 also illustrates a power cord at the rear of the enclosure.

FIG. 3 is a rear view of enclosure 47, including rear surface 146 of housing 49, Also visible in FIG. 3 are connector cables 111, 115, and 119 extending from underneath enclosure 47 between adjustable feet 51. A power cord 157 extending from rear surface 146 is also visible at the rear of enclosure 47.

Figure 4:
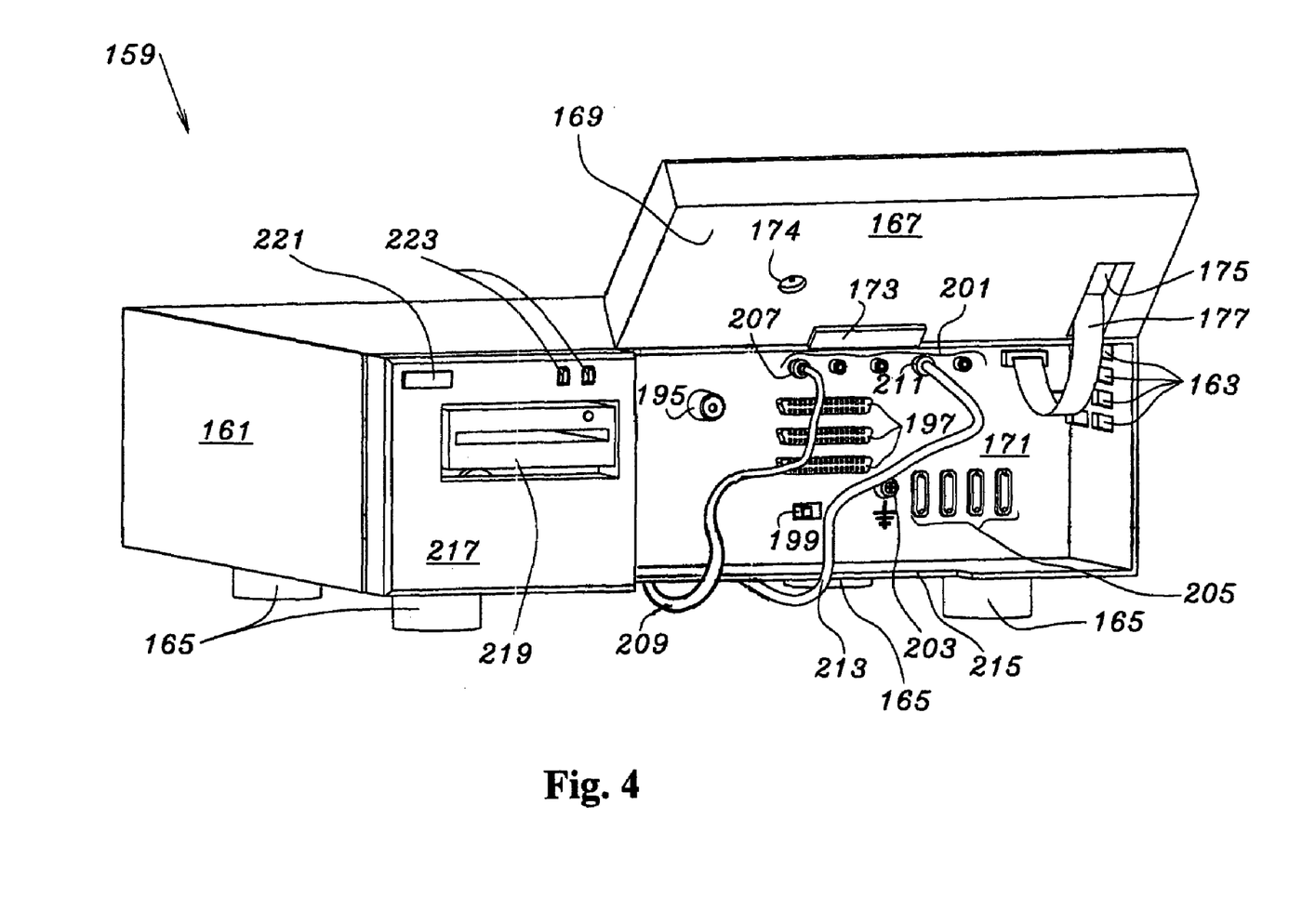
FIG. 4 is a perspective front view of a second embodiment of the present invention and illustrates an enclosure which is nearly identical to the enclosure of the first embodiment shown in FIGS. 1 through 3 but which includes a fixed front panel in addition to a moveable front accessible control panel.
Figure 5:
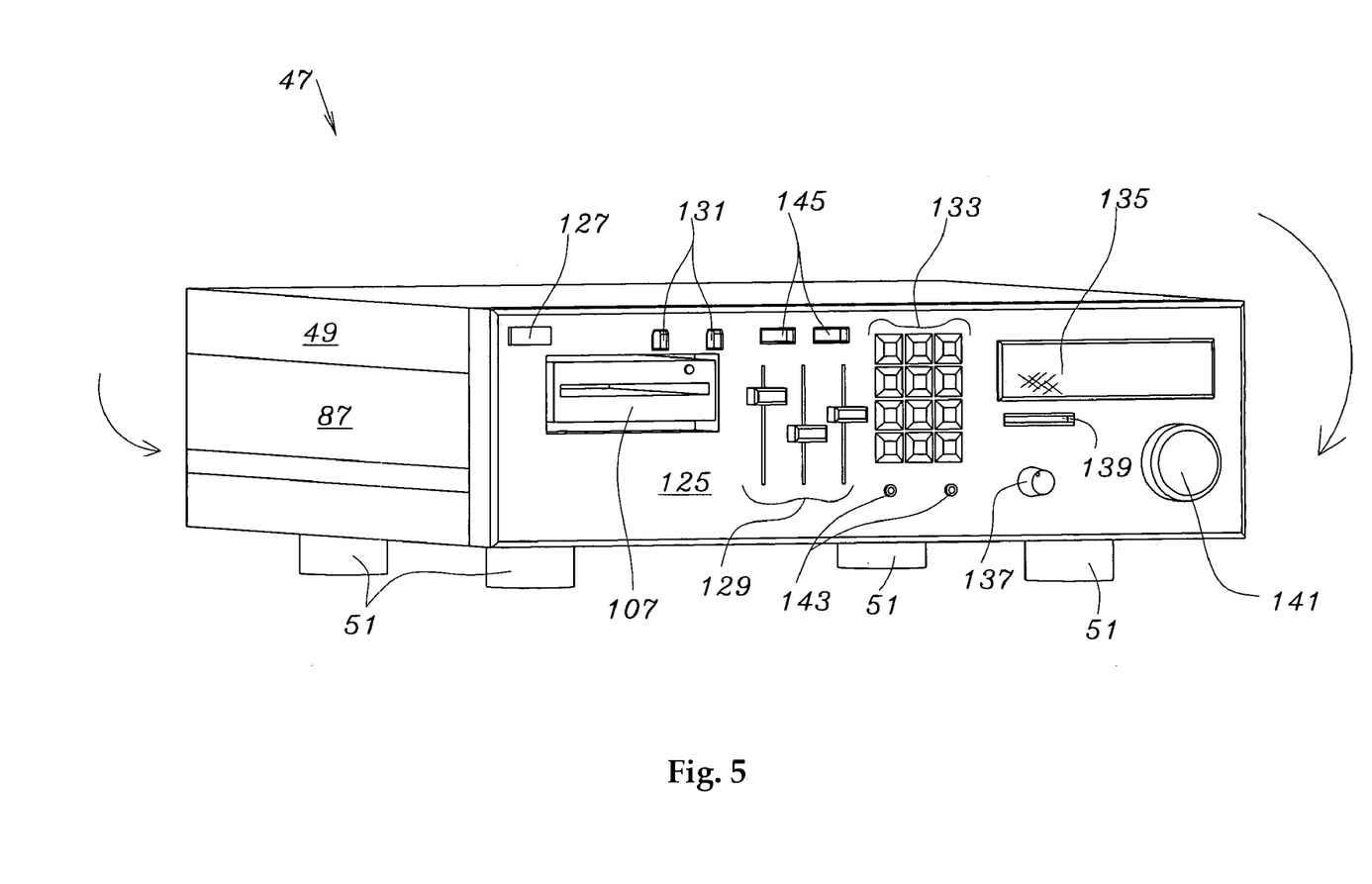
Figure 6:
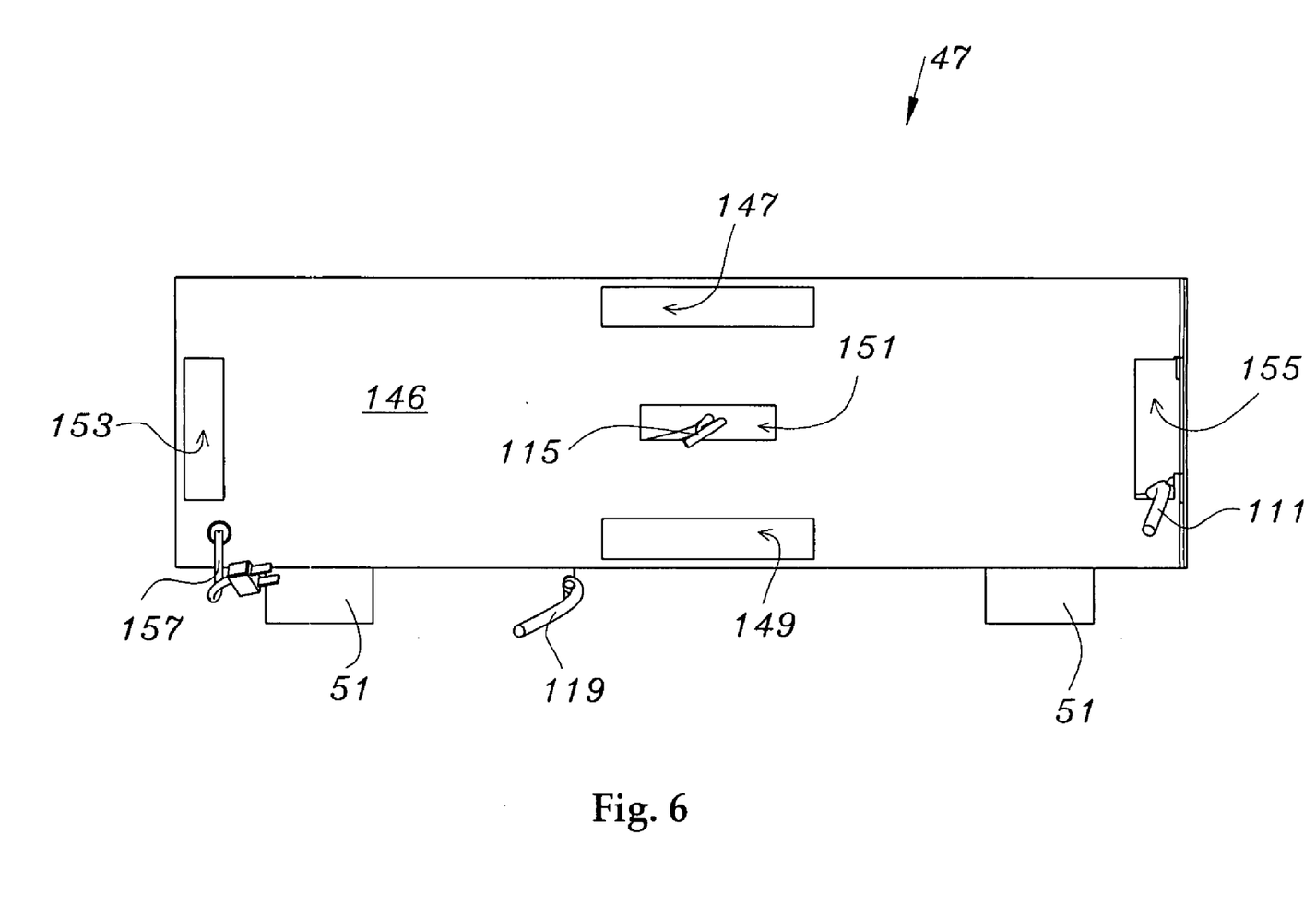
Figure 7:
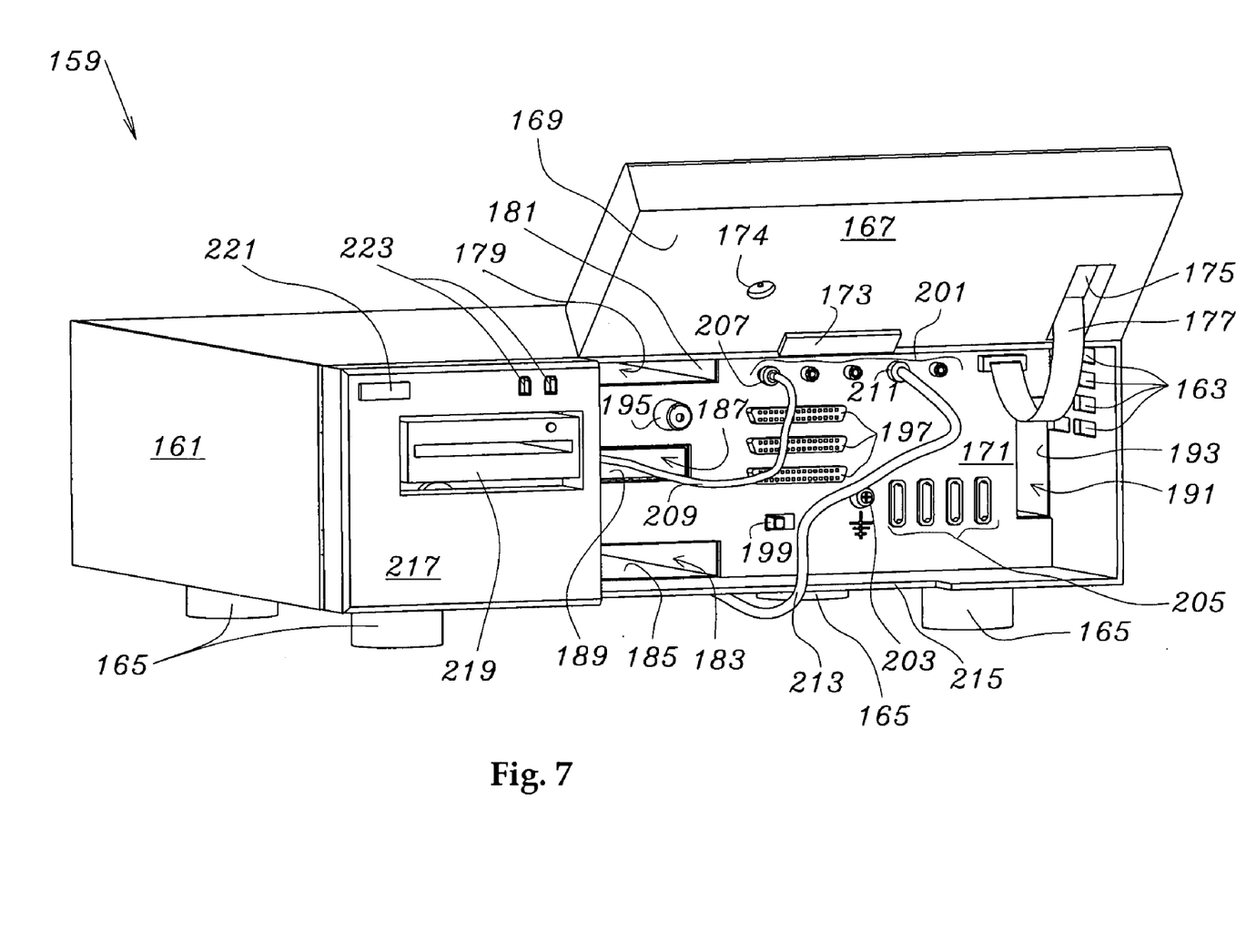

FIG. 4 is a perspective front view of a second embodiment of the present invention which illustrates an enclosure 159 which is nearly identical to enclosure 47 illustrated in FIGS. 1 through 3 with the exception of a few salient features which will be illuminated after a brief enumeration of the features common to both the first and second embodiments.

Like enclosure 47, enclosure 159 may include a housing 161 having side vents 163, adjustable feet 165, a moveable right front accessible control panel 167 shown in an open position such that rear surface 169 visible, and a recessed connector panel 171 which is concealed when moveable right front accessible control panel 167 is closed. Moveable right front accessible control panel 167 is illustrated as attached to housing 161 by hinge 173 and includes a transmitter 174, and a recess 175 for accommodating ribbon connector 177.

For exemplary purposes, recessed connector panel 171 is illustrated as having a receiver 195 corresponding to transmitter 174, several parallel ports 197, a switch 199, a plurality of male connector ports 201, a ground 203, and several HDMI connectors 205.

A first connector 207 having an attached first connector cable 209 is illustrated as coupled with one of the male connector ports 201 and a second connector 211 having an attached second connector cable 213 is illustrated as coupled with another of the male connector ports 201. Both connector cables, 209 and 213, extend underneath enclosure 159 between adjustable feet 165 and toward the rear of enclosure 159. The lower front edge of housing 161 may include an indentation 215 which, together with rear surface 169 of moveable front accessible control panel 167, may define an accommodation space to protect cables when moveable right front accessible control panel 167 is closed.

Illustrated adjacent moveable right front accessible control panel 167 is a fixed left front panel 217 which is fixed relative to housing 161 and includes a disk drive 219, a power button 221, and a pair of sockets 223, all of which may be hard-wired to the internal components of enclosure 159. This arrangement might be desirable where enclosure 159 includes components such as removable media disk drives, fixed volume controls, or multi-pole switching assemblies.

Although the size of moveable right front accessible control panel 167 is shown approximately twice that of fixed left front panel 217 in FIG. 4, and although the shapes of both moveable right front accessible control panel 167 and fixed left front panel 217 are generally rectangular in FIG. 4, it is conceivable that either panel could be moveable and either panel, whether fixed or moveable, could be any shape or width which complements the adjacent panel. Further, although moveable right front accessible control panel 167 and fixed left front panel 217 completely conceal recessed connector panel 171 when closed, it is conceivable that recessed connector panel 171 may be partially or fully exposed as custom design warrants.

As in FIGS. 1 through 3, recessed connector panel 171 is optimally set back from rear surface 169 of moveable right front accessible control panel 167 as required to minimize damage to connector cables. Additionally, although moveable right front accessible control panel 167 is shown with centered hinge 173, moveable right front accessible control panel 167 may be hinged at any side, may be completely removable, or may be attached to housing 161 by any method which allows similar movement or removal. Likewise, recessed connector panel 171 may have any number and variety of connectors thereon and is not limited to the type and configuration of connectors in FIG. 4, which are primarily shown as examples.

Although the invention has been derived with reference to particular illustrative embodiments thereof, many changes and modifications of the invention may become apparent to those skilled in the art without departing from the spirit and scope of the invention. Therefore, included within the patent warranted hereon are all such changes and modifications as may reasonably and properly be included within the scope of this contribution to the art.

What is claimed is:

1. An enclosure for an electronic device comprising:
   a housing;
   a connector panel supported by the housing and which supports at least one connector;
   a front accessible control panel comprising at least one control mechanism that communicates with at least one controlled component inside the enclosure, movably attached to the housing in front of the connector panel and having a front surface and a rear surface, and wherein the front accessible control panel has a closed position and an open position to provide access to connectors on the connector panel, and wherein the connector panel is installed a sufficient distance behind the rear surface of the front accessible control panel to create a space between the connector panel and the rear surface of the front accessible control panel such that any cables connected to the at least one connector on the connector panel are allowed an appropriate bending radius to reverse their direction within the enclosure and toward the rear of the enclosure; and
   wherein the bottom surface of the enclosure includes a mechanism for passage of cables from the space between the connector panel and the rear surface of the front accessible control panel to the space between the undersurface of the housing and any adjacent supporting structure; and
   wherein the bottom surface of the enclosure includes support members raising the housing to create a space between the undersurface of the housing and any adjacent supporting surface permitting the routing of cables from a front connector panel to the rear of the enclosure.

2. The enclosure recited in claim 1 wherein the support members are vertically adjustable in height to allow for increased ventilation within the enclosure when desired or necessary due to an abundance of cables being routed beneath the enclosure.

3. The enclosure recited in claim 1 and further comprising a receiver on its recessed connector panel to receive a signal from a transmitter on its front accessible control panel to allow control of components inside the housing when the moveable control panel is closed.

* * * * *